United States Patent [19]

Brosig et al.

[11] Patent Number: 5,120,623
[45] Date of Patent: Jun. 9, 1992

[54] METHOD OF PRODUCING A SUBSTRATE PLATE FOR A LIQUID CRYSTAL CELL WITH BLACK MATRIX AREAS

[75] Inventors: Stefan Brosig, Stuttgart; Jurgen Waldmann, Schonaich, both of Fed. Rep. of Germany

[73] Assignee: Nokia Unterhaltungselektronik GmbH, Fed. Rep. of Germany

[21] Appl. No.: 624,076

[22] Filed: Dec. 7, 1990

[30] Foreign Application Priority Data

Dec. 8, 1989 [DE] Fed. Rep. of Germany ....... 3940640

[51] Int. Cl.$^5$ .............................................. G03C 5/00
[52] U.S. Cl. ..................................... 430/20; 430/311; 430/313; 430/314; 430/317; 430/328; 430/329; 359/67; 359/82
[58] Field of Search ................. 430/20, 258, 311, 312, 430/313, 314, 317, 325, 327, 328, 329; 350/339 R

[56] References Cited

U.S. PATENT DOCUMENTS 4,948,706 8/1990 Sugihara et al. ..................... 430/20

Primary Examiner—Marion E. McCamish
Assistant Examiner—Kathleen Duda
Attorney, Agent, or Firm—Ware, Fressola, Van Der Sluys & Adolphson

[57] ABSTRACT

A method of producing a substrate plate for a liquid crystal cell with black matrix areas in which blackened polymer material is already deposited before the structured areas of photosensitive resist overlying the structured electrode areas are removed. Rather, these structured areas of photosensitive resist are removed only after the blackened polymer material has been hardened.

This processing sequence has the advantage that no special alignment processes are needed in order to arrange the black matrix areas accurately between the electrode areas. This alignment is obtained autonomously by virtue of the fact that the electrode areas, even after they have been structured with the help of the photosensitive resist areas, are still covered by these selfsame photosensitive resist areas, thereby ensuring in an ideal manner that only the areas between the electrode areas will be filled with black matrix material and this in such a way as to make them butt directly against the electrode areas, so that the maximum possible surface will be covered by black matrix material.

4 Claims, 2 Drawing Sheets

METHOD OF PRODUCING A SUBSTRATE PLATE FOR A LIQUID CRYSTAL CELL WITH BLACK MATRIX AREAS

BACKGROUND OF THE INVENTION

1. Field of the Invention

The present invention relates to a method of producing a substrate plate for a liquid crystal cell with black matrix areas. Such black matrix areas are indeed preferably arranged in places where the substrate plate is free of electrode areas.

2. Description of the Prior Art

Black matrix areas have hitherto been applied by means of one of two known methods. One of these methods is a photolithographic method, while the other is a printing method.

Both methods commence by producing structured electrode areas. To this end

- a photosensitive resist is first applied to a segmental plate provided with an electrode layer;
- this photosensitive resist is then exposed to light through a mask;
- the exposed photosensitive resist is developed and
- the electrode layer is then etched away at the point where the photosensitive resist has been removed.

In both the known methods the next processing step consists of removing the remaining photosensitive resist. In the photolithographic method this is followed by depositing a layer of blackened polymer material on the entire substrate surface with the electrode areas and then applying a photosensitive resist to this blackened layer. Subsequently, a mask is carefully and accurately aligned with respect to the electrode areas to ensure that, following exposure, the photosensitive resist can be developed in such a way as to permit the removal of those parts of the blackened layer that are underlain by the electrode areas. Blackened material will therefore remain only between the electrode areas.

In the printing method, on the other hand, the aforementioned removal of the remaining photosensitive resist is followed by carefully and accurately aligning a printing device with respect to the electrode areas, this being done in such a way that the subsequent printing will deposit blackened polymer material only in the interstices between electrode areas. The printed material is then hardened.

It is quite obvious that in both the known methods considerable costs are incurred in order to ensure accurate alignment of the exposure mask and/or the printing device with respect to the electrode areas.

SUMMARY OF THE INVENTION

The method according to the invention differs from the known methods by virtue of the fact that the blackened polymer material is applied prior to the removal of the parts of the photosensitive resist layer that are underlain by areas of the electrode layer that have not been etched away. The following steps are performed after the partial etching away of the electrode layer:

- a blackened polymer material is deposited on the entire substrate surface with the electrode areas and the photosensitive resist areas;
- the blackened polymer material is hardened, and
- the still remaining areas of photosensitive resist are removed, together with the blackened polymer material deposited on them, so that such blackened polymer material will remain only in the areas between the electrode areas.

This processing sequence is entirely devoid of adjustment or aligning steps, because the residual photosensitive resist areas are utilized for the purpose of ensuring that black matrix material can be applied only between the electrode areas. As compared with a traditional processing sequence for producing a substrate plate without black matrix areas, therefore, one only needs the additional steps of depositing the blackened polymer material and then hardening the deposited material. Over and above this simplification of the processing as compared with other methods of producing black matrix areas, the method according to the invention also has the advantage of ensuring with absolute certainty that the black matrix material not only covers the non-electrode areas, but also that it is every where in direct contact with the electrode areas, so that the maximum possible surface area is covered by black matrix material.

With a view to ensuring that the blackened polymer material can be readily removed in the areas where the photosensitive resist has been removed, it will be of advantage, depending on the particular polymer material that is being used, to employ only relatively slight prehardening of the polymer material, at about 130° C. for example, and to obtain the desired final degree of hardening only by means of post-hardening after the removal of the photosensitive resist and the areas of polymer material deposited on it.

Given substrate plates for liquid crystal cells where the liquid crystal layer is very thin, it may be of advantage to smooth the level differences between the electrode areas and the black matrix areas by means of an equalization layer. All the commercially available equalization layer materials are suitable for this purpose.

Carbon is preferably used for blackening polymer materials. A suitable material, for example, is described in DE 38 12 030 A1. The polymer material referred to in this specification is a resin that is hardened by means of drying. Polyimide is another suitable polymer material. This material, once again, can be hardened by afterbaking. But it is also possible to use photosensitive resins or imides or other polymers that are hardened by exposure to UV radiation.

It is very advantageous if, following the etching away of the electrode layer in specified areas, hollows can be etched into the substrate in these areas. This is associated with two advantages. The first of these is that it becomes possible to produce blackened areas of greater thickness and therefore with an improved impression of blackness. The second advantage is that the absolute shrinkage of the blackened layer during hardening becomes greater, which ensures that the blackened areas will either no longer project above the level of the electrode layer or project only very slightly above it.

DETAILED DESCRIPTION OF THE PREFERRED EMBODIMENT

Figure 1:
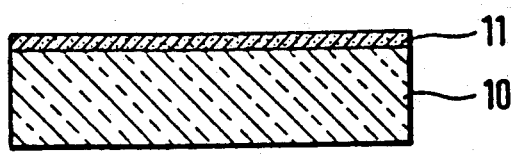
FIG. 1 shows a schematic cross section through a substrate with an electrode layer.
Figure 2:
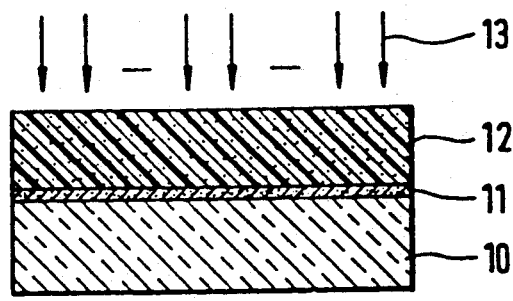
FIG. 2 shows a cross section as in FIG. 1 with an additional photosensitive resist layer that is exposed through a mask
Figure 3:
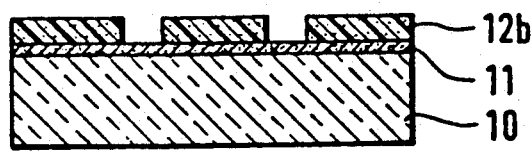
FIG. 3 shows a cross section as in FIG. 2 with a developed photosensitive resist layer
Figure 4:
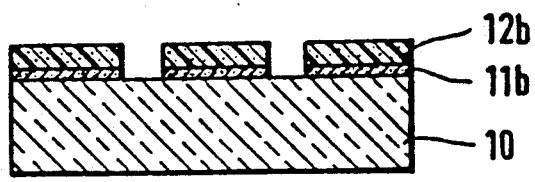
FIG. 4 shows a cross section as in FIG. 3 with a etched electrode layer

The starting point of the method described herein below is a substrate plate 10 made of glass and carrying an electrode layer 11 of ITO. A typical substrate plate 10 has a thickness of 1 to 2 mm, while the electrode layer 11 will have a thickness of about 0.1 mm. A photosensitive resist layer 12 is then applied in the customary manner, by spincoating for example, to the entire substrate plate 10 with the electrode layer 11, as shown in FIG. 2. This layer is then exposed to light through a mask 13. The embodiment here considered employs a photosensitive resist that becomes soluble in alkalis after exposure. If the photosensitive resist is now treated with a slightly alkaline solution, the exposed parts are removed, so that only isolated photosensitive resist areas 12b remain behind. These may be elongated strips, for example, though in FIG. 3 they are shown only in section. The subsequent processing step makes use of a solvent for the electrode layer 11. In the embodiment here considered, for example, dilute hydrochloric acid was sprayed on at 55° C.

This caused the electrode areas not covered by the photosensitive resist areas 12b to become etched away, so that only the electrode areas 11b below the photosensitive resist areas 12b remained behind.

Figure 5:
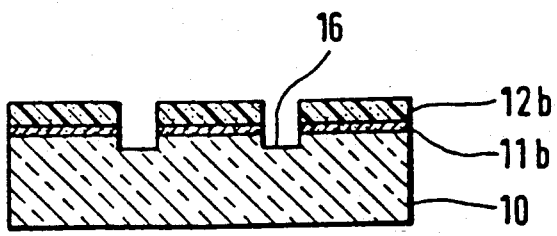
FIG. 5 shows a cross section as in FIG. 4 with cavities etched into the substrate material

All the processing steps up to this point have been exactly as in the traditional methods. While all the known traditional methods, quite irrespective of whether they are used for producing substrate plates with black matrix areas or plates without such areas, next proceed to remove the photosensitive resist areas 12b, the method according to the invention employs a different procedure. The next processing step, the result of which is illustrated in FIG. 5, consists of using hydrofluoric acid to etch the substrate in the areas where the electrode layer 11 has been removed, thereby producing the cavities 16. Using 4% hydrofluoric acid at room temperature, cavities having a depth of several microns can be produced by means of an etching process lasting a few minutes. Cavities having a depth of 4 mm were produced in the embodiment here described.

Figure 6:
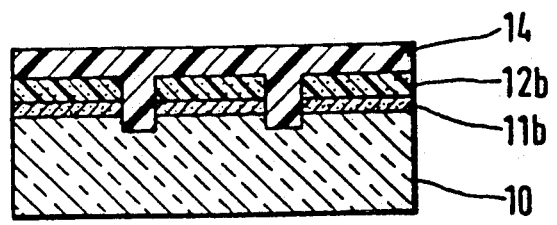
FIG. 6 shows a cross section as in FIG. 5 with an applied layer of blackened polymer material

A blackened polymer material 14 is then applied to the entire substrate surface with the electrode areas 11b and the photosensitive resist areas 12b. The result of this processing step is illustrated by FIG. 6. "Black Matrix DARC" supplied by Messrs. Brewer Science, a US company, was the material used in the embodiment under consideration. A concentrated solution of this polymer was poured onto the substrate plate and the excess material removed with a squeegee. It was then dried and subsequently prehardened at 130° C. next the residual photosensitive resist areas 12b, together with the overlying black matrix material 14, were removed with a dilute alkaline solution. Consequently, on the substrate plate 10 there only remained the electrode areas 11b and the black matrix areas 14b situated between them, all as shown in FIG. 7.

Figure 7:
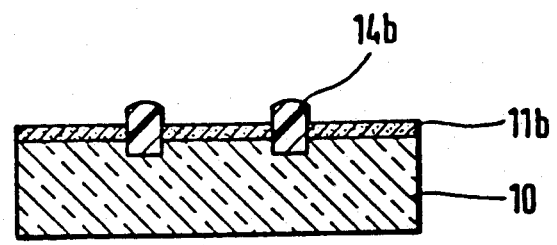
FIG. 7 shows a section as in FIG. 6 after the removal of the remaining areas of photosensitive resist
Figure 8:
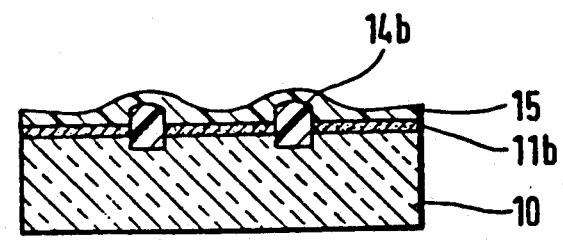
FIG. 8 shows a cross section as in FIG. 7 with an additional equalization layer.

It should be noted that the black matrix areas 14b in FIG. 7 do not project substantially above the electrode areas 11b. This characteristic can be preserved if due account is taken of the following. After the drying of the blackened material and the removal of the photosensitive resist areas 12b, the height to which the black matrix areas 14b project above the electrode areas 11b will be the same as the original height of the photosensitive resist areas 12b above the electrode areas 11b, i.e. 1 mm in the case of the embodiment under consideration. The total thickness of the black matrix area will then be of the order of 5.1 mm, which corresponds to the sum of the depth of the etched cavities 16 (4 mm), the thickness of the electrode areas 11b (0.1 mm) and the thickness of the photosensitive resist areas 12b (1 mm). But the black material shrinks very considerably during drying and hardening, about 20% in the embodiment under consideration, so that on completion the surface of the blackened areas will to all intents and purposes come to lie in the same plane as the surface of the electrode areas 11b.

When producing the cavities 16, care should be taken to make their depth such that the overall depth of blackened material will be sufficiently great to obtain an absorption of incident light coming from outside that will be as close as possible to 100%. As regards the material used in the present embodiment, this calls for a layer thickness of the order 4–5 mm. Smaller layer thicknesses will be sufficient when carbon particles are used. The depth of the cavities is therefore determined primarily by the desired absorption result. When the depth of the cavities and the thickness of the photosensitive resist layer are known, the shrinkage behaviour of the blackened material is preferably set in such a way that, following hardening, the surface of the blackened material will come to lie substantially in the same plane as the surface of the electrode areas 11b. The shrinkage behaviour can be determined, above all, by adjusting the quantity of the solvent in which the blackened material is dissolved. However, if the shrinkage behaviour cannot be set in such a way as to cause the surface of the black matrix areas to shrink down to the plane of the surfaces of the electrode areas 11b, this constitutes little or no prejudice to the proper functioning of a liquid crystal cell.

At this point, attention should also be drawn to the fact that FIGS. 1 to 8 are not true to scale. Considering a liquid crystal cell for use as a television display, the black matrix areas 14b will have a width of 25 mm and a maximum thickness of about 1.1 mm, which corresponds to the sum of the thickness of the electrode areas (about 0.1 mm) and the thickness of the photosensitive resist areas prior to shrinkage (about 1 mm). The black matrix areas 14b have the form of elongated strips, which are arranged at intervals of about 25 mm centre to centre. If for the purposes of ready visualization the distance of 1 mm is replaced by 1 m, this would mean that on a level glass surface extending for several kilometers in all directions there would be arranged stripshaped electrode areas having a height of 10 cm and a width of 225 m, each pair of such areas being separated by an intervening black matrix area rising to a height of 1.1 m and having a width of 25 m.

An orientation layer can be applied directly to the product as shown in FIG. 7, if necessary also a sequence consisting of a barrier layer made of SiO2 and an orientation layer. The orientation layer is then rubbed in the usual manner with a velvet roll. The example of the preceding paragraph shows that this rubbing is not unduly prejudiced by any black matrix areas that may still project above the general level. But if there is to be certainty that the rubbing will be practically unhindered by projecting black matrix areas 14b, the structure as shown in FIG. 7 is provided with a traditional equalization layer 15 (FIG. 8) prior to the application of an orientation layer (not shown) or a layer sequence of the type described above. As material for the equalization or planarization layer one may use, among others, "Selektilux HTRB-200" supplied by the Merck Company.

Before applying any other layers to the structure as shown in FIG. 7, however, the black matrix material is post-hardened for one hour at 250° C.

Attention should be drawn to the fact that any known material and any known deposition method can be used—each for its own particular purpose—in the processing sequence described above. What is new are not the materials used or the methods for depositing these materials, but rather the processing sequence itself, namely the fact that the blackened polymer material is applied before the structure photo sensitive resist areas 12b are removed from the structured electrode areas 11b. The etching of cavities is not essential in order to obtain the simplified processing sequence for applying the blackened electrode areas. Rather, it constitutes an additional measure that will prove appropriate whenever particularly high absorption by the blackened areas is to be assured. But the etching of the cavities enjoys the same advantage as the application of the blackened layer, namely the fact that the photosensitive resist layers 12b, which are in any case already present, can be used as mask for structuring the electrode layer 11. With a view to ensuring that the etchant will etch only the areas to which the blackened polymer material is to be applied, the etchant must either be applied locally or the remaining substrate areas must be coated in such a way as to prevent them from being attacked. In the latter case the whole of the substrate plate can be dipped into the etching solution, for example a dilute solution of hydrofluoric acid.

What is claimed is:

1. A method of producing a substrate plate for a liquid crystal cell with black matrix areas in which
    a photosensitive resist is applied to a substrate plate provided with an electrode layer,
    the photosensitive resist layer is exposed to light through a mask,
    the exposed photosensitive resist layer is developed, and the electrode layer is then etched away in the places where the photosensitive resist layer has been removed, characterized in that
    a blackened polymer material is applied to the entire substrate surface including the photosensitive resist areas covering the electrode areas that have remained after developing and etching,
    the blackened polymer material is hardened, and
    the still remaining photosensitive resist areas are removed, the blackened polymer material situated n these areas being removed with them, so that such blackened polymer material is to be found only in the areas between the electrode areas.

2. A method according to claim 1, characterized in that the blackened polymer material is post-hardened after the removal of the photosensitive resist.

3. A method according to claim 1, characterized in that said method includes an additional step after the final step, wherein a planarization layer is deposited on the electrode areas and the areas of blackened polymer material.

4. A method according to claim 1, characterized in that the parts of the substrate where the electrode layer has been etched away are etched in order to produce indentations for the blackened polymer material.

* * * * *

UNITED STATES PATENT AND TRADEMARK OFFICE
CERTIFICATE OF CORRECTION

PATENT NO. : 5,120,623

DATED : June 9, 1992

INVENTOR(S) : Stefan Brosig; Jurgen Waldmann

It is certified that error appears in the above-identified patent and that said Letters Patent is hereby corrected as shown below:

Column 6, line 22 "n" should be --on--

Signed and Sealed this

Tenth Day of August, 1993

Attest:

MICHAEL K. KIRK

*Attesting Officer*     Acting Commissioner of Patents and Trademarks